(12) United States Patent
Lu et al.

(10) Patent No.: US 11,824,106 B2
(45) Date of Patent: *Nov. 21, 2023

(54) SEMICONDUCTOR DEVICE AND METHOD OF FABRICATING THE SAME

(71) Applicant: Taiwan Semiconductor Manufacturing Company, Ltd., Hsinchu (TW)

(72) Inventors: Chun-Chieh Lu, Taipei (TW); Chao-Ching Cheng, Hsinchu (TW); Tzu-Ang Chao, Hsinchu (TW); Lain-Jong Li, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 3 days.

This patent is subject to a terminal disclaimer.

(21) Appl. No.: 17/585,482

(22) Filed: Jan. 26, 2022

(65) Prior Publication Data
US 2022/0149193 A1  May 12, 2022

Related U.S. Application Data

(63) Continuation of application No. 16/926,766, filed on Jul. 12, 2020, now Pat. No. 11,239,354.
(Continued)

(51) Int. Cl.
*H01L 29/76* (2006.01)
*H01L 29/24* (2006.01)
(Continued)

(52) U.S. Cl.
CPC ...... *H01L 29/7606* (2013.01); *H01L 21/0262* (2013.01); *H01L 21/02568* (2013.01);
(Continued)

(58) Field of Classification Search
CPC ........... H01L 29/7606; H01L 21/02568; H01L 21/0262; H01L 29/24; H01L 29/41733;
(Continued)

(56) References Cited

U.S. PATENT DOCUMENTS 11,239,354 B2 * 2/2022 Lu ............... H01L 29/66787
2018/0358474 A1 * 12/2018 Li ............... H01L 29/66969

* cited by examiner

*Primary Examiner* — Tong-Ho Kim
(74) *Attorney, Agent, or Firm* — JCIPRNET

(57) ABSTRACT

A transistor device having fin structures, source and drain terminals, channel layers and a gate structure is provided. The fin structures are disposed on a material layer. The fin structures are arranged in parallel and extending in a first direction. The source and drain terminals are disposed on the fin structures and the material layer and cover opposite ends of the fin structures. The channel layers are disposed respectively on the fin structures, and each channel layer extends between the source and drain terminals on the same fin structure. The gate structure is disposed on the channel layers and across the fin structures. The gate structure extends in a second direction perpendicular to the first direction. The materials of the channel layers include a transition metal and a chalcogenide, the source and drain terminals include a metallic material, and the channel layers are covalently bonded with the source and drain terminals.

20 Claims, 10 Drawing Sheets

Related U.S. Application Data

(60) Provisional application No. 62/928,362, filed on Oct. 31, 2019.

(51) Int. Cl.
*H01L 29/417* (2006.01)
*H01L 29/66* (2006.01)
*H01L 29/786* (2006.01)
*H01L 21/02* (2006.01)

(52) U.S. Cl.
CPC ........ *H01L 29/24* (2013.01); *H01L 29/41733* (2013.01); *H01L 29/66969* (2013.01); *H01L 29/78618* (2013.01); *H01L 29/78696* (2013.01)

(58) Field of Classification Search
CPC ......... H01L 29/66969; H01L 29/78618; H01L 29/78696; H01L 29/66787; H01L 29/78681
USPC .......................................................... 257/29
See application file for complete search history.

SEMICONDUCTOR DEVICE AND METHOD OF FABRICATING THE SAME

CROSS-REFERENCE TO RELATED APPLICATION

This application is a continuation application of and claims the priority benefit of U.S. application Ser. No. 16/926,766, filed on Jul. 12, 2020 and now allowed, which claims the priority benefit of U.S. provisional application Ser. No. 62/928,362, filed on Oct. 31, 2019. The entirety of each of the above-mentioned patent applications is hereby incorporated by reference herein and made a part of this specification.

BACKGROUND

The field-effect transistors (FET) are three terminal semiconductor devices, with source, drain and gate terminals. Controlled by the voltage applied to the gate, the charge carriers, such as electrons or holes, flow from the source to drain though an active channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
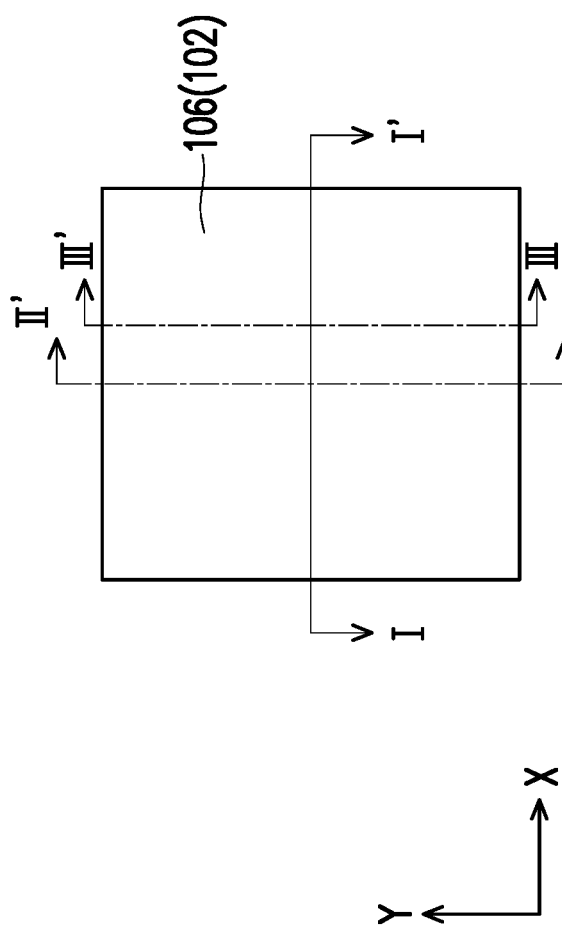
FIG. 1A to FIG. 9B are schematic top views and sectional views showing various stages in a method of forming a transistor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transition metal dichalcogenides (TMDs) have been considered as material candidates for small scaled or ultrasmall devices due to their decent energy gap and single-atomic thickness. Transition metal dichalcogenide (TMD) monolayers are atomic thin layers of $ME_2$, with a transition metal atom M (e.g. molybdenum (Mo), tungsten (W), etc.) and chalcogen atoms E (e.g. sulfur (S), selenium (Se), or tellurium (Te)). TMDs are also categorized as 2D materials for their extraordinary thinness. TMD bulk crystals are formed of monolayers bound to each other by Van-der-Waals attraction. TMD monolayers have a direct band gap, and can be used in electronic devices such as TMD-based field-effect transistors (TMD-FETs).

FIG. 1A to FIG. 9B are schematic top views and sectional views showing various stages in a method of fabricating a transistor device in accordance with some embodiments of the present disclosure. The process of fabricating the FET device according to some embodiments will be described in detail below.

Figure 1B:
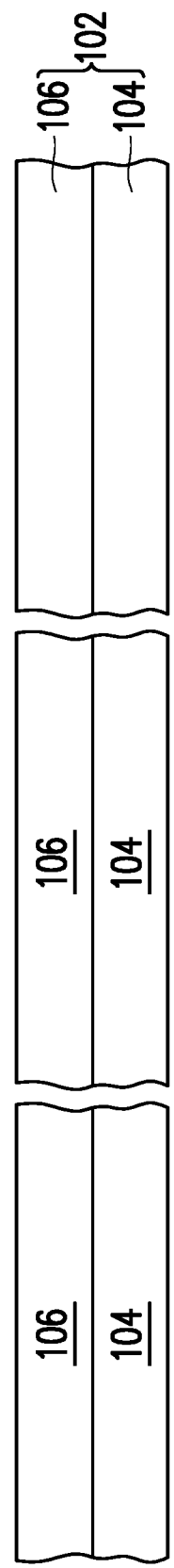

FIG. 1A shows the schematic top view of one stage in a method of fabricating a FET device in accordance with some embodiments of the present disclosure. FIG. 1B shows sectional views of the structure shown in FIG. 1A along three different cross-section lines, and from the left to the right showing the sectional views along cross-section lines I-I', II-II' and III-III'. Referring to FIG. 1A and FIG. 1B, a stack 102 of a first material layer 104 and a second material layer 106 is provided. The material of the first material layer 104 and the material of the second material layer 106 are electrically insulating materials. In one embodiment, the material of the first material layer 104 or the second material layer 106 includes a dielectric material such as silicon oxide, silicon oxynitride or silicon nitride. In one embodiment, the material of the first material layer 104 or the second material layer 106 includes a crystalline material such as sapphire. In one embodiment, the material of the first material layer 104 or the second material layer 106 includes a semiconductor material such as silicon or a suitable semiconductor material. Other semiconductor materials including diamond or germanium, a suitable compound semiconductor (such as gallium arsenide, silicon carbide, indium arsenide, or indium phosphide), or a suitable alloy semiconductor (such as silicon germanium carbide, gallium arsenic phosphide, or gallium indium phosphide), may also be used. The disclosure is not limited thereto. In some embodiments, the materials of the first material layer 104 and the second material layer 106 are different. In some embodiments, the materials of the first material layer 104 and the second material layer 106 are substantially the same. In one embodiment, the second material layer 106 is made of a crystalline material such as sapphire having a thickness ranging from about 10 nm to about 60 nm. The thickness of the first material layer 104 is thick enough to support the structure and for isolation.

In some embodiments, the first material layer 104 and the second material layer 106 are sequentially formed and stacked. In some embodiments, the first material layer 104 or the second material layer 106 is formed by chemical vapor deposition (CVD), such as plasma enhanced CVD (PECVD) or low-pressure CVD (LPCVD) or atomic layer deposition (ALD). In some embodiments, the first material layer 104 or the second material layer 106 is formed by physical vapor deposition (PVD). In some embodiments, the first material layer 104 or the second material layer 106 is formed by thermal oxidation, dry oxidation or wet oxidation. In one embodiment, the crystalline material may be formed by epitaxial growth or provided in bulk and then cut into desirable shapes. During the formation of the first material layer 104 or the second material layer 106, nitridation or dopant doping process(es) may be optionally performed.

Figure 2A:
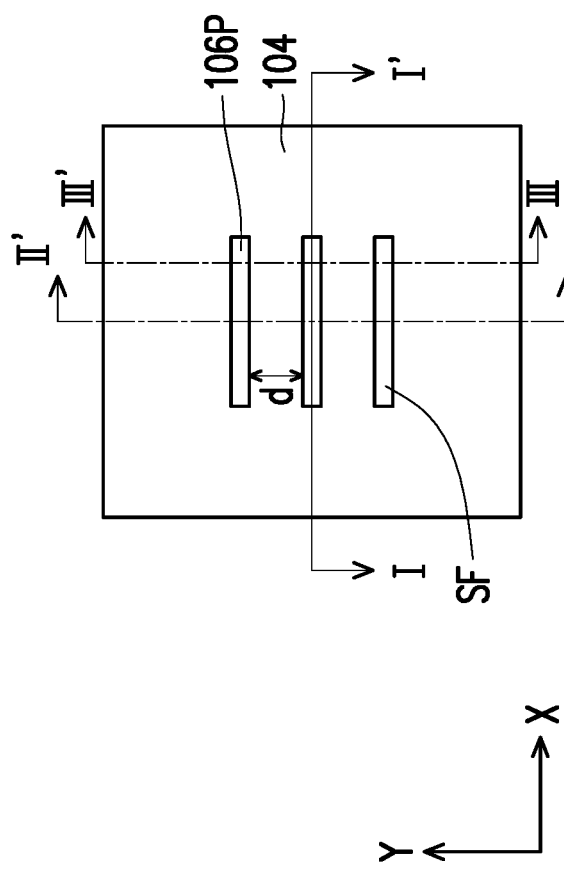
Figure 2B:
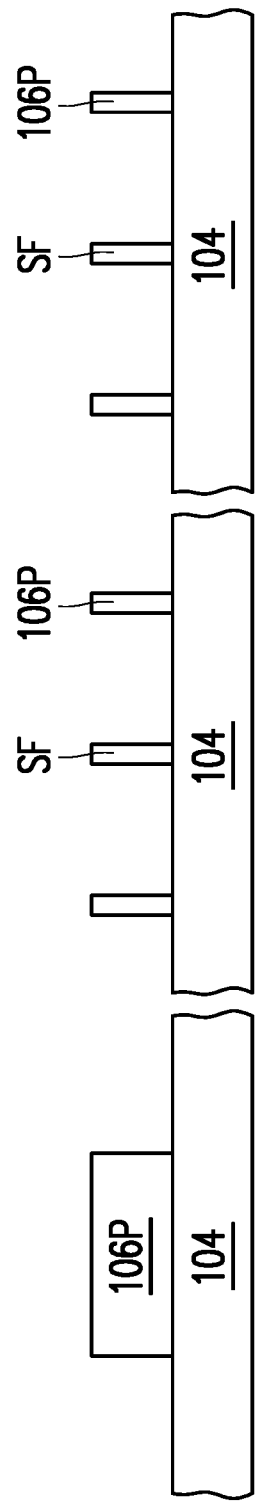

FIG. 2A shows the schematic top view of one stage in a method of fabricating a FET device in accordance with some embodiments of the present disclosure. FIG. 2B shows sectional views of the structure shown in FIG. 2A along three different cross-section lines, and from the left to the right showing the sectional views along cross-section lines I-I', II-II' and III-III'. Referring to FIG. 2A and FIG. 2B, the second material layer 106 is patterned into a patterned second material layer 106P and the underlying first material layer 104 is partially exposed. In some embodiments, the patterned second material layer 106P includes strip fin patterns SF extending in X-direction. As shown in FIG. 2B, the strip fin patterns SF have three strip fins arranged in parallel and spaced apart from each other with a distance d. The height of the strip fin patterns SF (in the thickness direction) is slightly smaller than or substantially equivalent to the original thickness of the second material layer 106 before patterning. However, more or less than three strip fins are possible, and the number, the geometric shape and the arrangement of the patterns are not limited to the embodiments of the present disclosure. In some embodiments, the formation of the patterned second material layer 106P includes an etching process. For example, the formation of the patterned second material layer 106P includes forming a mask layer (not shown) over the second material layer 106 by CVD or coating and then etching the second material layer 106 using the mask layer as the etching mask to transfer the pattern(s) of the mask layer to form the patterned second material layer 106P. In one embodiment, the patterned second material layer 106P is prepared by a photolithography process and a dry etching process to form parallel strip patterns SF. In another embodiment, a wet etching process is performed, and the etchant(s) used in the wet etching process includes sulfuric acid, phosphoric acid, hydrofluoric acid or a mixture thereof. Then, the mask layer is removed.

Figure 3A:
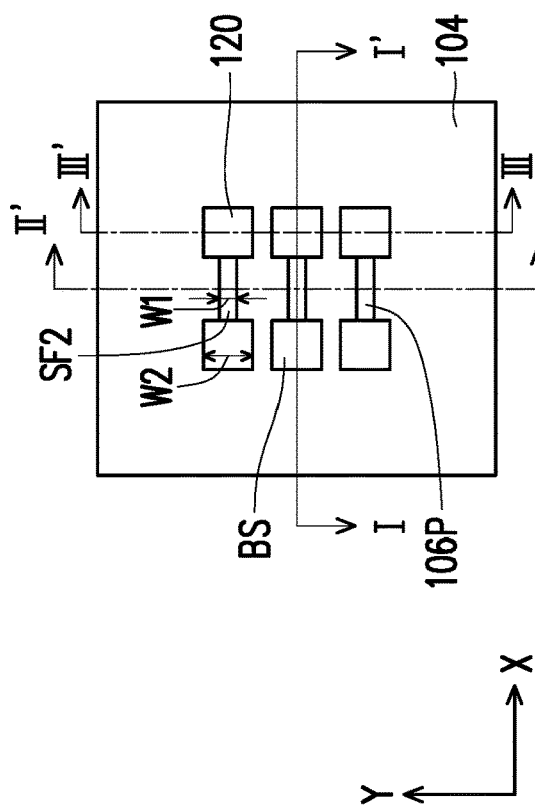
Figure 3B:
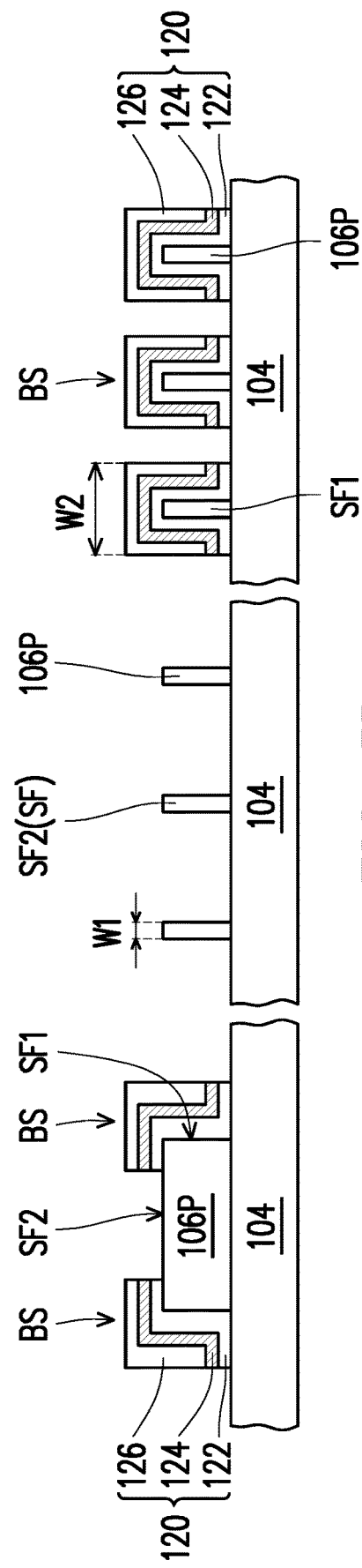

FIG. 3A shows the schematic top view of one stage in a method of fabricating a FET device in accordance with some embodiments of the present disclosure. FIG. 3B shows sectional views of the structure shown in FIG. 3A along three different cross-section lines, and from the left to the right showing the sectional views along cross-section lines I-I', II-II' and III-III'. Referring to FIG. 3A and FIG. 3B, in some embodiments, a first metal oxide layer 122, a second metal layer 124 and a third metal oxide layer 126 are sequentially formed and stacked in sequence as pattern stacks 120. The first metal oxide layer 122 or the third metal oxide layer 126 may be formed by PVD or CVD. In some embodiments, the material of the first metal oxide layer 122 or the third metal oxide layer 126 includes at least a transition metal oxide material. In certain embodiments, the first metal oxide layer 122 or the third metal oxide layer 126 is a layer made of a transition metal oxide material such as molybdenum oxide (MoO), tungsten oxide (WO), or mixtures thereof. In one embodiment, the materials of the first metal oxide layer 122 and the third metal oxide layer 126 are substantially the same. In one embodiment, the materials of the first metal oxide layer 122 and the third metal oxide layer 126 are different. In some embodiments, the material of the second metal layer includes platinum (Pt), palladium (Pd), gold (Au), nickel (Ni), titanium (Ti) or the combinations thereof. The second metal layer 124 may be formed by PVD or CVD.

As shown in FIG. 3B, the second metal layer 124 is sandwiched between the first and third metal oxide layers 122, 126. In one embodiment, the first metal oxide layer 122 and the third metal oxide layer 126 is formed with a thickness ranging from about 1 nm to about 50 nm. In one embodiment, the second metal layer 124 is formed with a thickness ranging from about 1 nm to about 50 nm. For example, the thickness ratio of the first metal oxide layer 122, the second metal layer 124 and the third metal oxide layer 126 is about 1:1:1. In FIG. 3B, the first metal oxide layer 122, the second metal layer 124 and the third metal oxide layer 126 formed over the first material layer 104 conformally wrap around the strip fin patterns SF.

Referring to FIG. 3A and FIG. 3B, in one embodiment, the first metal oxide layer 122, the second metal layer 124 and the third metal oxide layer 126 are formed as pattern stacks 120. In some embodiments, the first metal oxide layer 122, the second metal layer 124 and the third metal oxide layer 126 are sequentially and conformally deposited and then patterned. For example, the first metal oxide layer 122, the second metal layer 124 and the third metal oxide layer 126 are sequentially formed over the exposed first material layer 104 and the patterned second material layer 106P and covered the strip fin patterns SF, and then are patterned into pattern stacks 120 covering end portions SF1 of the strip fin patterns SF and exposing portions SF2 of the strip fin patterns SF. In some other embodiments, the pattern stacks 120 are formed by individually forming the first metal oxide layer 122, the second metal layer 124 and the third metal oxide layer 126 by lift-off processes. As seen in FIG. 3A, the strip fin pattern SF has a width W1 (in the Y-direction) smaller than the width W2 (in the Y-direction) of the block BS. The pattern stacks 120 may be formed to have a predetermined configuration or pattern located on the patterned second material layer 106P and the underlying first material layer 104. In some embodiments, the pattern stacks 120 are constructed to include three pairs of rectangular or square shaped blocks BS respectively located above and covering two opposite ends of each of the three strip fin patterns SF. In one embodiment, the first metal oxide layer 122, the second metal layer 124 and the third metal oxide layer 126 of the pattern stack 120 conformally cover the top surface and sidewalls of the portions SF1. In embodiments, the first metal oxide layer 122, the second metal layer 124 and the third metal oxide layer 126 of the pattern stack 120 function as stacked layers of nucleation seeds for assisting the seeded growth and the formation of thin transition metal dichalcogenides (TMDs) materials in the subsequent growth process. For example, the metal atoms present in the second metal layer 124 mainly provide the metal atoms or element in the later formed source/drain terminals, while the metal atoms present in the first and third metal oxide layer 122, 126 may provide the metal atoms or elements in TMD materials of the later formed channel layer.

It is understood that three or more layers of alternately deposited metal oxide layers and metal layers may be formed and piled into the pattern stacks 120, even though three layers are described in the above disclosure to form the pattern stacks 120.

Figure 4A:
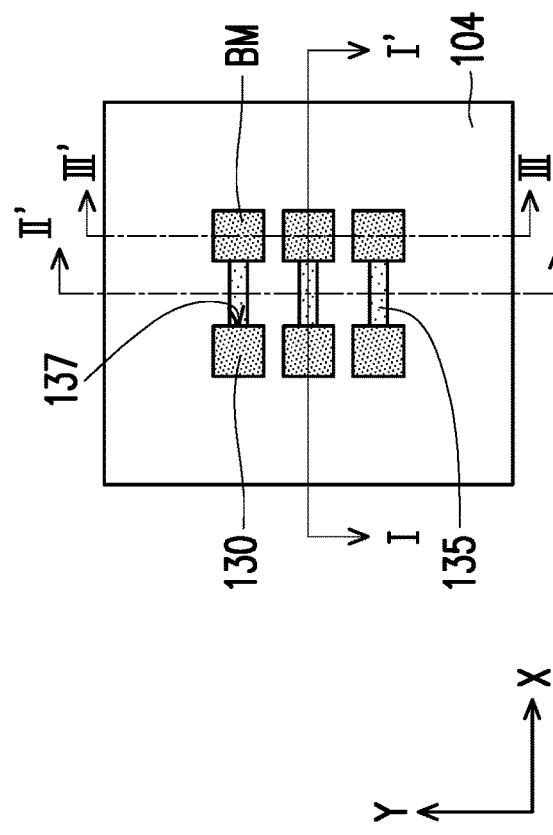
Figure 4B:
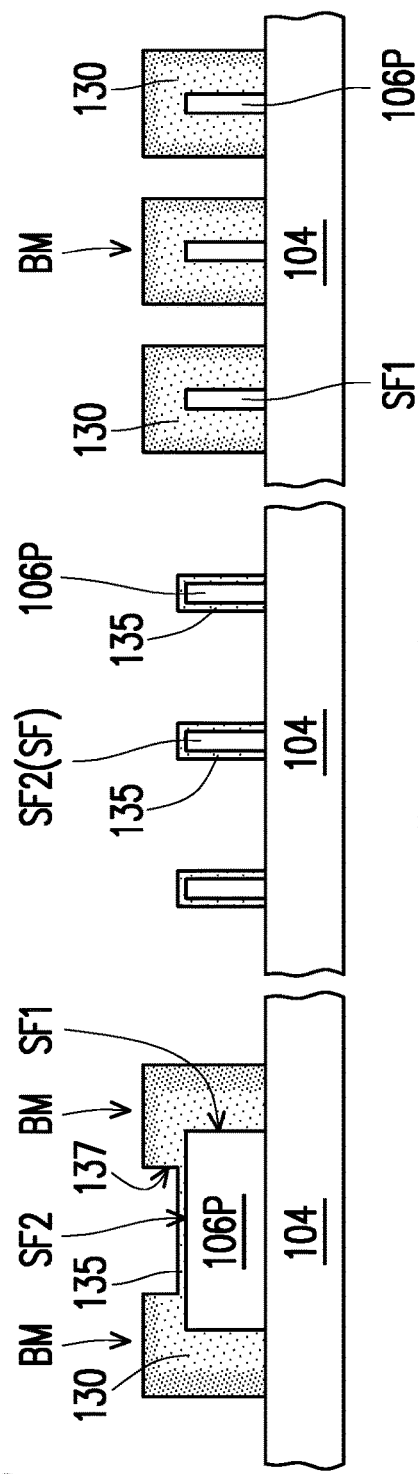

FIG. 4A shows the schematic top view of one stage in a method of fabricating a FET device in accordance with some embodiments of the present disclosure. FIG. 4B shows sectional views of the structure shown in FIG. 4A along three different cross-section lines, and from the left to the right showing the sectional views along cross-section lines I-I', II-II' and III-III'. Referring to FIG. 4A and FIG. 4B, after forming the pattern stacks 120, a growth process is performed to form a third material layer 136 covering the strip fin patterns SF, and the third material layer 136 is formed with end portions at the locations of the pattern stacks 120 and middle extending portions extending between the opposing end portions. In some embodiments, the formed third material layer 136 is formed into different portions with different materials, and the third material layer is formed with metallic stacks 130 and a channel layer 135 extending between the metallic stacks 130. Through the growth process, the pattern stacks 120 are turned into the third material layer including the channel layer 135 and the metallic stacks 130, and the channel layer 135 and the metallic stacks 130 are formed with strong covalent bonding to each other. In some embodiments, the metallic stacks 130 are formed on the patterned second material layer 106P at the exact locations of the pattern stacks 120. In one embodiment, the pattern stacks 120 are turned into the metallic stacks 130 through the growth process. In some embodiments, the material of the metallic stacks 130 includes a metal alloy containing the metal atoms or element present in the second metal layer 124. In some embodiments, the material of the metallic stacks 130 mainly includes an alloy containing platinum (Pt), palladium (Pd), gold (Au), nickel (Ni), titanium (Ti) or the combinations thereof. Also, the alloy material of the metallic stacks 130 may also include the metal element or atoms from the first or third metal oxide layer 122 or 126. That is, the alloy material of the metallic stacks 130 may also include W or Mo. The metallic stacks 130 may function as the metal source and drain terminals of the transistor structure, while the channel layer 135 extending between the metallic stacks 130 and located under the subsequently formed gate structure may function as the channel of the transistor structure. In some embodiments, as seen in FIG. 4A, the metallic stacks 130 are shaped as three pairs of rectangular or square shaped blocks BM respectively located above and covering two opposite ends of each of the three strip fin patterns SF. In one embodiment, the metallic stacks 130 cover the sidewalls and the top surfaces of portions SF1 of the strip fin patterns SF. For example, the sizes or dimensions of the blocks BM may be similar to or substantially equivalent to those of the blocks BS.

In some embodiments, referring to FIG. 4A and FIG. 4B, the channel layer 135 is formed right on the patterned second material layer 106P that is not covered by the pattern stacks 120. That is, the channel layer 135 is formed on the exposed portions SF2 of the strip fin patterns SF. The formation of the channel layer 135 on the three-dimensional structure (strip fin patterns SF) can increase the effective channel width, which is beneficial for the device performance and saves the active area for higher device density. In one embodiment, the channel layer 135 conformally covers the exposed portions SF2 of the strip fin patterns SF, covering the sidewalls and the top surface of the exposed portions SF2. In some embodiments, the material of the channel layer 135 includes one or more types of transition metal chalcogenides such as transition metal dichalcogenides (TMDs). For example, the TMDs may be denoted as $ME_2$, with a transition metal atom M (e.g. Mo, W, etc.) and chalcogen atoms E (e.g. S, Se, or Te). In certain embodiments, the channel layer 135 includes single or multiple atomic thin layers made of a TMD material such as molybdenum disulfide ($MoS_2$), molybdenum diselenides ($MoSe_2$), molybdenum ditelluride ($MoTe_2$), tungsten disulfide ($WS_2$), tungsten diselenides ($WSe_2$), or mixture thereof.

In some embodiments, the growth process includes a CVD process. The CVD process may include a process performed by, for example, electron cyclotron resonance CVD (ECR-CVD), microwave plasma CVD, plasma enhanced CVD (PECVD), low-pressure CVD (LPCVD), thermal CVD or hot filament CVD. In some embodiments, the CVD process is a thermal CVD process performed at a temperature ranging from about 600° C.~1000° C. or about 700° C.~900° C. In some embodiments, the CVD process is a PECVD process performed at a temperature ranging from about 400° C.~800° C. In other embodiments, the growth process is a physical vapor deposition (PVD) process. In general, the growth process utilizing patterned nucleation seeds for forming TMDs is a well-controlled process and the formation is performed on-site (at the same location). Compared with the transferring formation method of the TMDs, the growth process used in the present embodiments is well applicable for high density or fine pitch integrated circuitry. The reaction gas used in the chemical vapor deposition includes, for example, a chalcogen-containing gas. The chalcogen containing gas contains, for example, sulfur (S), selenium (Se), tellurium (Te) or a mixture thereof. For example, for the TMDs included in the channel layer 135, the metal atoms or elements in TMD materials may be provided by the metal atoms present in the first and third metal oxide layer 122, 126 of the pattern stack(s) 120, and the chalcogen(s) may provide from the reaction gas used in the growth process. In one embodiment, when the metal oxide includes $WO_3$, one reaction gas includes selenium (Se), and hydrogen gas is provided during the growth process, the resultant TMDs include tungsten diselenides ($WSe_2$). An exemplary reaction formula is shown as follows.

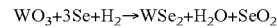

$$WO_3 + 3Se + H_2 \rightarrow WSe_2 + H_2O + SeO_2$$

Figure 10:
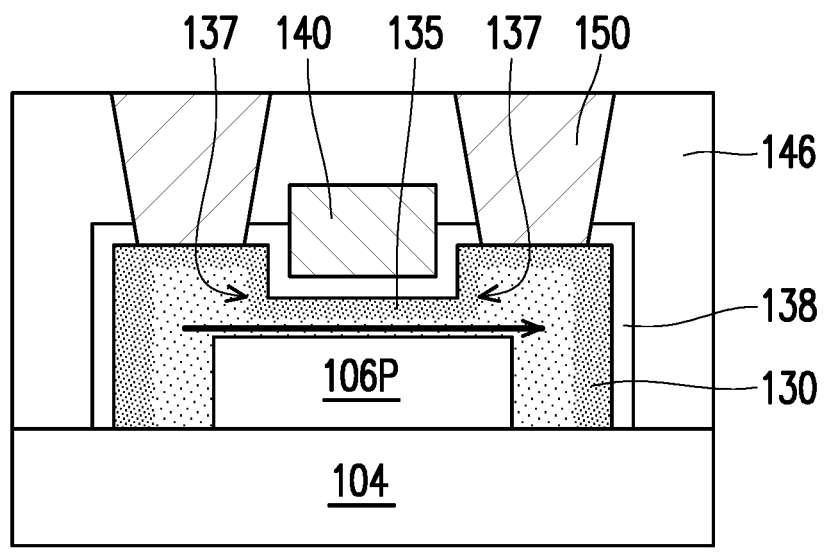
FIG. 10 is a schematic cross-sectional view of a transistor device in accordance with some embodiments of the present disclosure.
Figure 11:
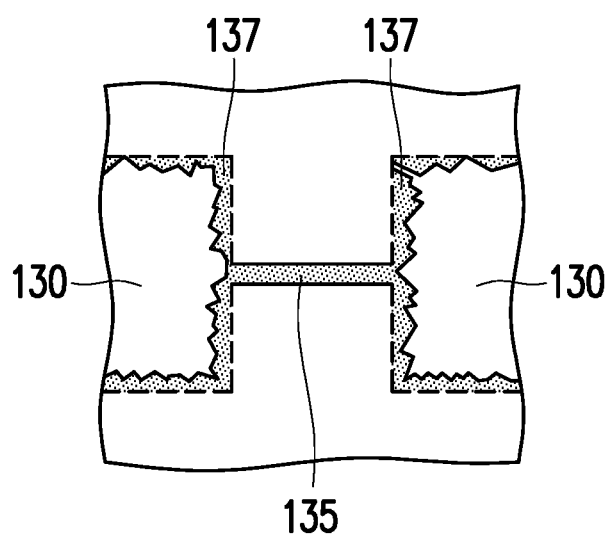
FIG. 11 is a schematic top view showing the channel layer and adjacent regions in the structure of a transistor device.

FIG. 10 is a schematic cross-sectional view of a transistor device showing the current path between the source and drain terminals. FIG. 11 is a schematic top view showing the channel layer and adjacent gradation regions in the structure of a transistor device. Referring to FIG. 4A, FIG. 4B, FIG. 10 and FIG. 11, as the channel layer 135 and the metallic stacks 130 are formed simultaneously during the same growth process, the channel layer 135 and the metallic stacks 130 are formed with a covalent bonding region and there is no clear interface between the channel layer 135 and the metallic stacks 130. In some embodiments, the channel layer 135 is covalently bonded with the metallic stacks 130, and there are gradation regions 137 existing between the channel layer 135 and the metallic stacks 130. Referring to FIG. 11, the gradation regions 137 are located at opposite ends of the channel layer 135 and further extend into the metallic stacks 130 at locations adjoining with and/or adjacent to the channel layer 135. The gradation regions 137 include TMDs and metallic materials bonded together (i.e. a covalently bonded material of the TMD material and the metallic material covalently bonded together) and may be considered as material transition regions. Due to the existence of the gradation regions 137 between the channel layer 135 and the metallic stacks 130, the contact resistance between the channel layer 135 and the metallic stacks 130 becomes much lower. The gradation regions 137 help to establish the ends of the channel layer 135 covalently bonded with the metallic stacks 130, may be referred to as end-bonded contact scheme, which provides an efficient path for charge injection (seen as the arrow in FIG. 10) and thus lowers the contact resistance between the channel layer 135 and the metallic stacks 130.

Figure 5A:
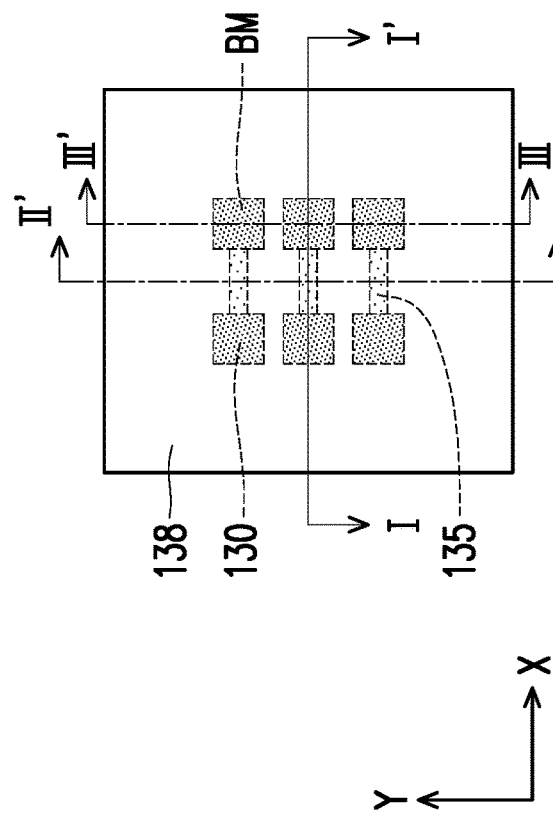
Figure 5B:
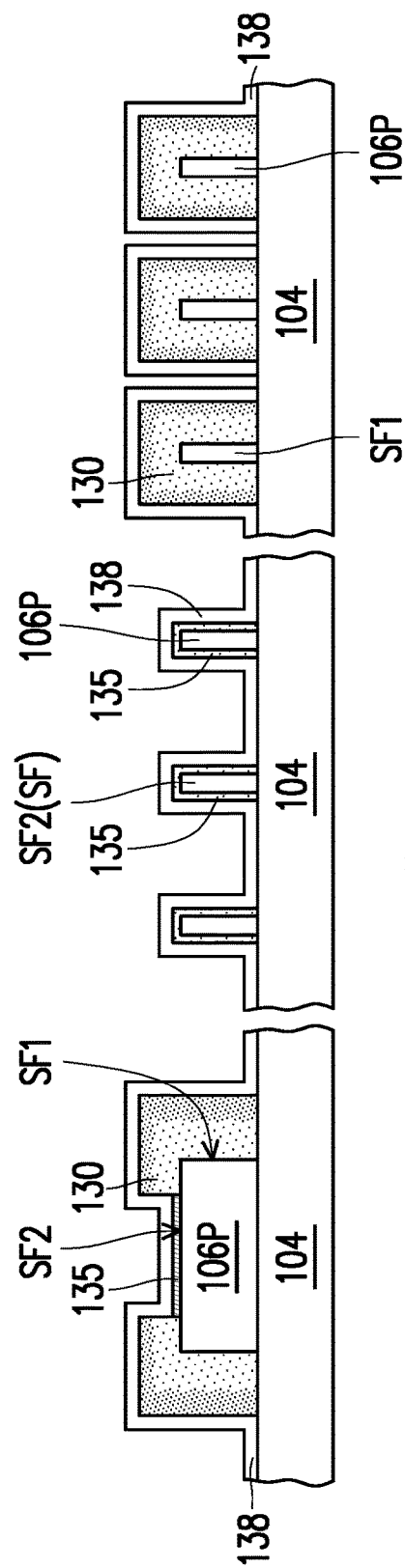

FIG. 5A shows the schematic top view of one stage in a method of fabricating a FET device in accordance with some embodiments of the present disclosure. FIG. 5B shows sectional views of the structure shown in FIG. 5A along three different cross-section lines, and from the left to the right showing the sectional views along cross-section lines I-I', II-II' and III-III'. Referring to FIG. 5A and FIG. 5B, a dielectric layer 138 is blanketly formed over the first material layer 104 and conformally covers the metallic stacks 130 and the channel layer 135. The material of the dielectric layer 138 includes an oxide material such as hafnium oxide (e.g. $HfO_2$), aluminum oxide (e.g. $Al_2O_3$), or zirconium oxide (e.g. $ZrO_2$), or other suitable high-k dielectric material(s). It should be noted that the high-k dielectric materials are generally dielectric materials having a dielectric constant larger than 3.9, or greater than about 10, or greater than about 12, or even greater than about 16. For example, the high-k materials may include metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof The material of the dielectric layer 138 may be formed by high-density-plasma chemical vapor deposition (HDP-CVD), sub-atmospheric CVD (SACVD), or atomic layer deposition (ALD). In some embodiments, the dielectric layer 138 has a thickness ranging from about 1 nm to about 20 nm or from about 1 nm to about 15 nm.

Figure 6A:
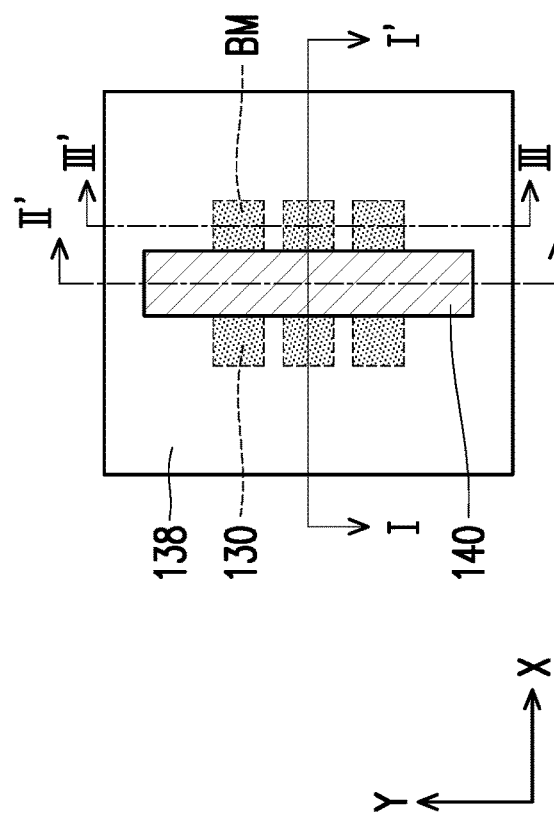
Figure 6B:
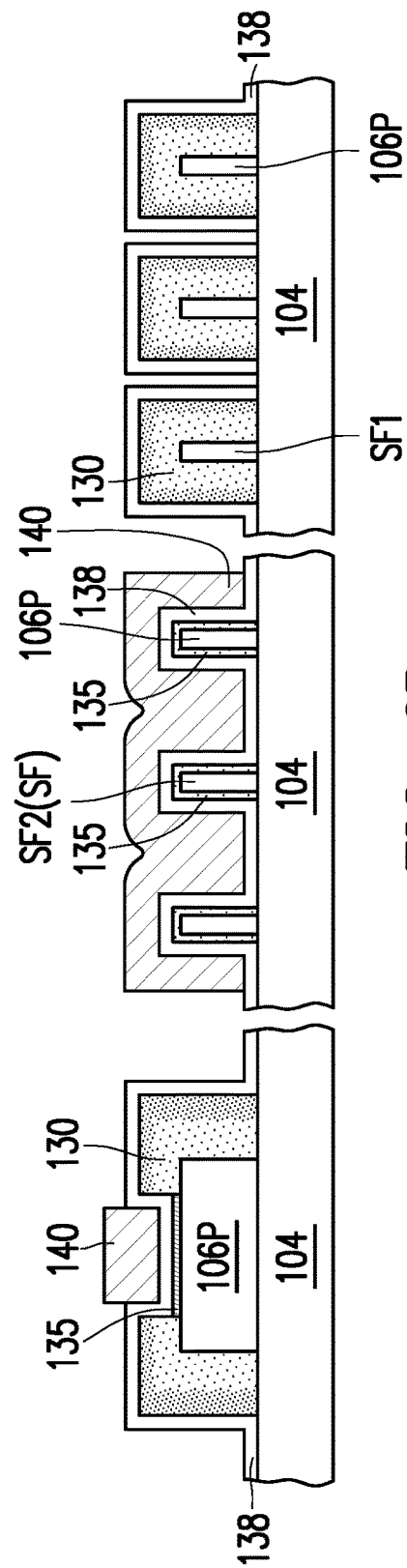

FIG. 6A shows the schematic top view of one stage in a method of fabricating a FET device in accordance with some embodiments of the present disclosure. FIG. 6B shows sectional views of the structure shown in FIG. 6A along three different cross-section lines, and from the left to the right showing the sectional views along cross-section lines I-I', II-II' and III-III'. Referring to FIG. 6A and FIG. 6B, a gate structure 140 is formed on the dielectric layer 138 and formed over the active channel layer 135 on the strip fin patterns SF. The gate structure 140 extends along the Y direction, and intersects with the strip fin patterns SF and covers the channel layer 135 located on the exposed portions SF2 of the strip fin patterns SF. In some embodiments, the gate structure 140 is shaped as a strip substantially perpendicular to the strip fin patterns SF. It is understood that the gate structure may be separated/cut into different sections based on the design requirement of the device. In some embodiments, the gate structure 140 may be formed by blanketly forming a gate electrode material layer (not shown) and then patterning the gate electrode material layer into the strip shaped gate structure. In some embodiments, the gate structure 140 has a thickness ranging from about 1 nm to about 10 nm. The dielectric layer 138 underlying the gate structure 140 functions as the gate dielectric layer.

In some embodiments, the material of the gate structure 140 includes a metal or a metal alloy, or metal nitride. For example, in some embodiments, the material of the gate structure 140 includes Pt, Pd, Au, W, TiN, tantalum nitride (TaN), tungsten nitride (WN), or combinations thereof. Moreover, the gate structure may further include a liner layer, an interfacial layer, a work function layer, or a combination thereof. In some alternative embodiments, a seed layer, a barrier layer, an adhesion layer, or a combination thereof may also be included between the gate structure 140 and the channel layer 135. In some embodiments, the gate structure 140 is formed by CVD or PVD.

Figure 7A:
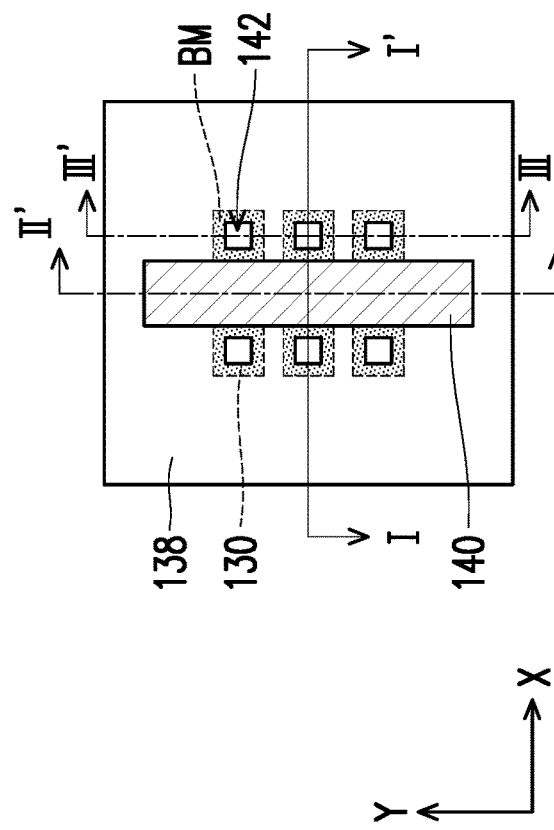
Figure 7B:
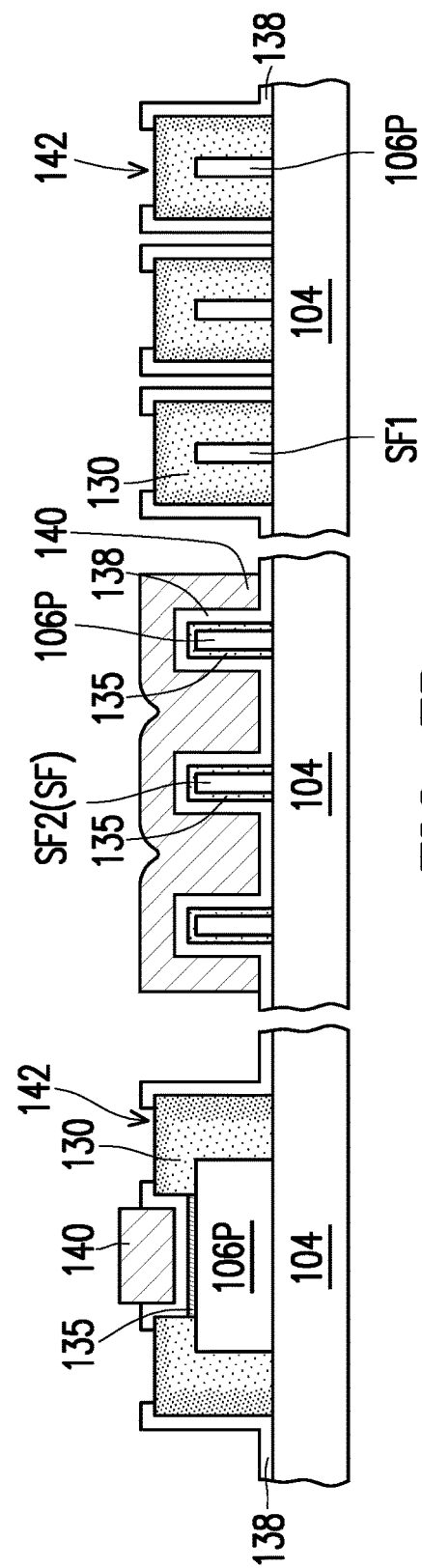

FIG. 7A shows the schematic top view of one stage in a method of fabricating a FET device in accordance with some embodiments of the present disclosure. FIG. 7B shows sectional views of the structure shown in FIG. 7A along three different cross-section lines, and from the left to the right showing the sectional views along cross-section lines I-I', II-II' and III-III'. Referring to FIG. 7A and FIG. 7B, after forming the gate structure 140, openings 142 are formed in the dielectric layer 138 at locations corresponding to the blocks BM of the metallic stacks 130. In one embodiment, the openings 142 are formed by patterning the dielectric layer 138 by using a photoresist (not shown) along with a photolithography process and a dry etching process, so that the dielectric layer 138 is partially removed to form the openings 142. In other embodiments, the openings 142 are formed through a wet etching process. In some embodiments, the openings 142 expose the underlying metallic stacks 130 but the openings 142 are of a size smaller than the size of the blocks BM of the metallic stacks 130. In the exemplary embodiment, six openings 142 are formed corresponding to six blocks BM, but the number or the locations of the openings 142 are not limited thereto.

Figure 8A:
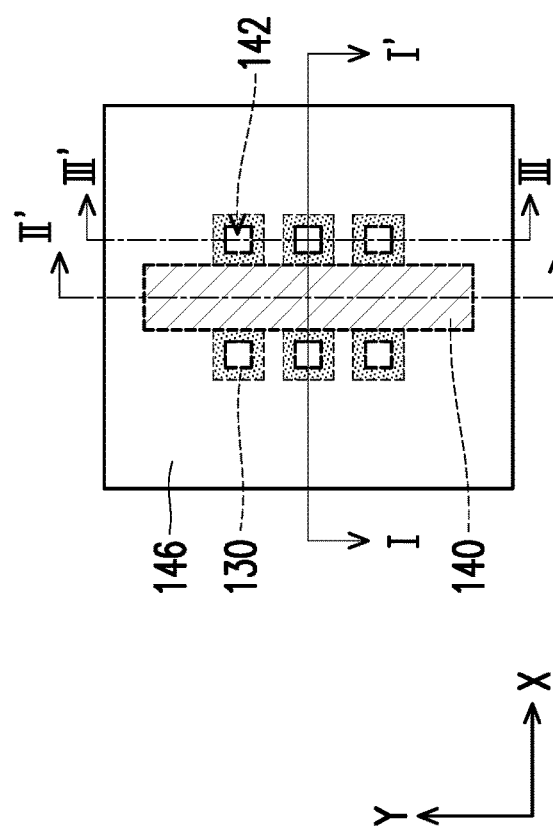
Figure 8B:
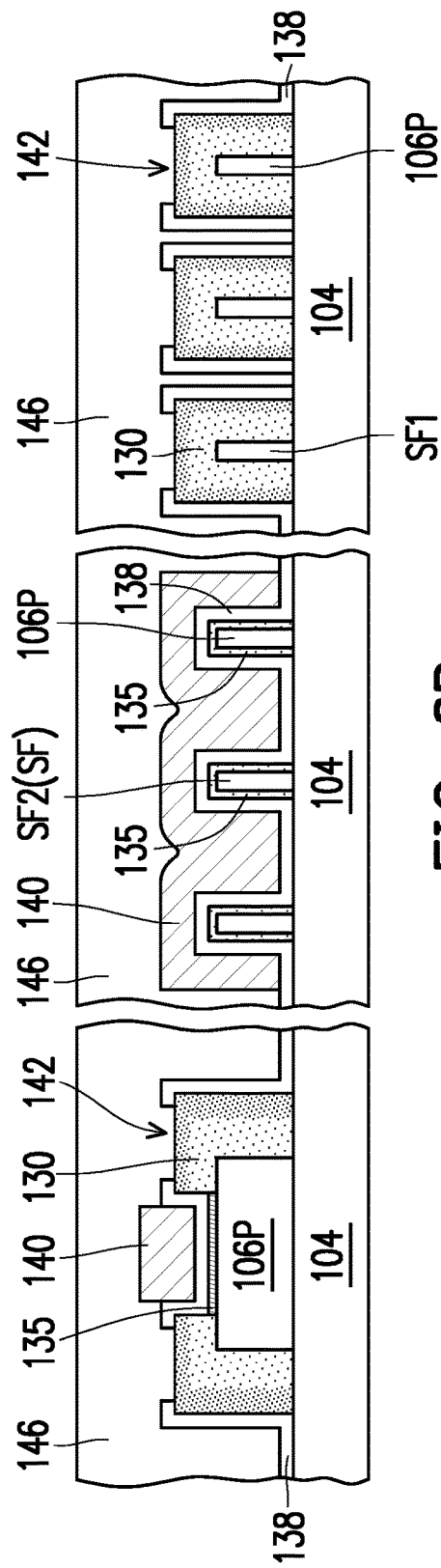

FIG. 8A shows the schematic top view of one stage in a method of fabricating a FET device in accordance with some embodiments of the present disclosure. FIG. 8B shows sectional views of the structure shown in FIG. 8A along three different cross-section lines, and from the left to the right showing the sectional views along cross-section lines I-I', II-II' and III-III'. Referring to FIG. 8A and FIG. 8B, in a next step, an interlayer dielectric (ILD) layer 146 is formed blanketly over the first material layer 104, covering the dielectric layer 138, the gate structure 140 and covering the metallic stacks 130 exposed by the openings 142. In some embodiments, the material of the ILD layer 146 includes silicon oxide, silicon nitride, or one or more low-k dielectric materials. Examples of low-k dielectric materials include silicate glass such as phospho-silicate-glass (PSG) and boro-phospho-silicate-glass (BPSG), BLACK DIAMOND®, SILK®, hydrogen silsesquioxane (HSQ), fluorinated silicon oxide (SiOF), amorphous fluorinated carbon, parylene, BCB (bis-benzocyclobutenes), flare, or a combination thereof. It is understood that the ILD layer 146 may include one or more dielectric materials or one or more dielectric layers. In some embodiments, the ILD layer 146 is formed to a suitable thickness by flowable CVD (FCVD), PECVD, HDPCVD, SACVD, spin-on coating, or other suitable methods. For example, an interlayer dielectric material layer (not shown) may be formed by PECVD to cover the dielectric layer 138, the gate structure 140, fill the openings 142 and cover the exposed metallic stacks 130. Optionally, an etching or polishing process may be performed to reduce the thickness of the interlayer dielectric material layer until a desirable thickness to form the ILD layer 146.

Figure 9A:
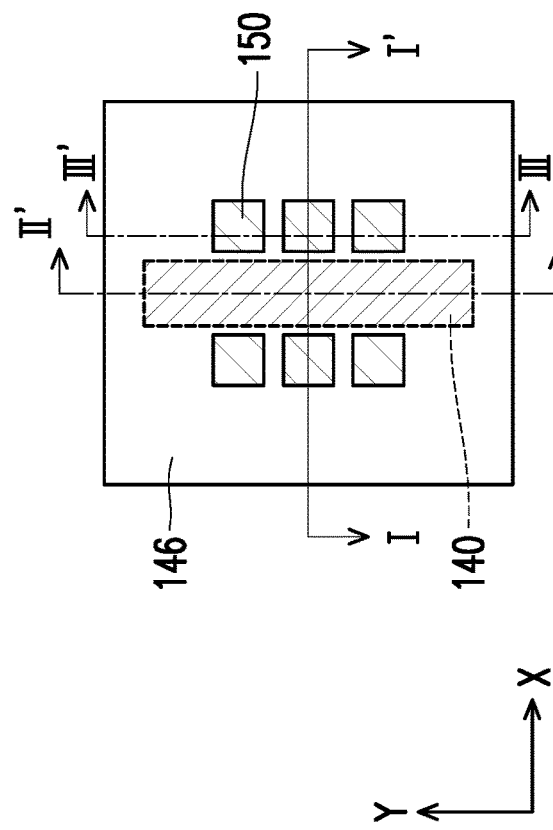
Figure 9B:
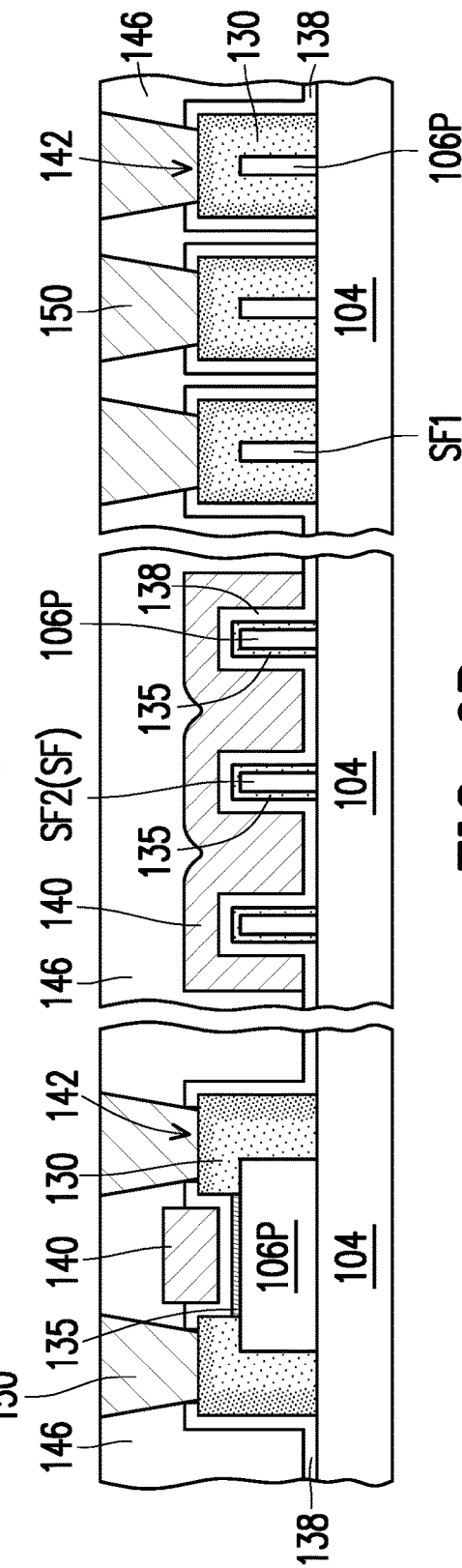

FIG. 9A shows the schematic top view of one stage in a method of fabricating a FET device in accordance with some embodiments of the present disclosure. FIG. 9B shows sectional views of the structure shown in FIG. 9A along three different cross-section lines, and from the left to the right showing the sectional views along cross-section lines I-I', II-II' and III-III'. Referring to FIG. 9A and FIG. 9B, after forming the ILD layer 146, contacts 150 are formed and a transistor device (e.g. FET device) is formed. In some embodiments, the contacts 150 are formed in the ILD layer 146 at locations right about the blocks BM of the metallic stacks 130. In some embodiments, the contacts 150 directly contact and are connected to the metallic stacks 130 respectively. In some embodiments, the formation of the contacts 150 includes forming a patterned mask layer (not shown) over the ILD layer 146, dry etching the ILD layer using the patterned mask layer as a mask to form contact openings exposing the metallic stacks 130. In certain embodiments, the locations of the contact openings exposing the metallic stacks 130 are aligned with and coincide with the locations of the openings 142. As seen in FIG. 9B, the contact openings are shown with slant sidewalls. It is understood that the contact openings may be formed with substantially vertical sidewalls if feasible. In some embodiments, the ILD layer 146 may further include an etch stop layer (not shown) therein for assisting the formation of the contact openings. Thereafter, a conductive material is deposited and filled into the contact openings to form the contacts 150. The conductive material is a metal layer including aluminum, copper, tungsten, or alloys thereof, for example. In one embodiment, the conductive material is formed by performing a CVD process. In one embodiment, the conductive material is formed by performing a PVD process. Optionally, the extra conductive material may be removed by performing a planarization process, an etching process, or other suitable processes. In some embodiments, the planarization process may include performing a chemical mechanical polishing (CMP) process. As seen in FIG. 9B, the top surface of the ILD layer 146 is substantially flush with and levelled with the top surface of the contacts 150.

In the illustrated embodiments, the described methods and structures may be formed compatible with the current semiconductor manufacturing processes. In exemplary embodiments, the described methods and structures are formed during back-end-of-line (BEOL) processes. In some embodiments, the described methods and structures may be formed during front-end-of-line (FEOL) processes. In some embodiments, the described methods and structures may be formed during middle-of-line processes. In one embodiment, the FET device is a logic device.

In the exemplary embodiment, the formation of the channel layer made of TMDs leads to lower contact resistance between the channel layer and the source and drain terminals. In addition, the formed metallic stacks (as the source and drain terminals) not only has lower resistance itself but also reduce the resistance between the contacts and the source and drain terminals.

In the above-mentioned embodiments, through the same growth process, the channel layer and the source and drain terminals are formed along with gradation regions therebetween. The gradation regions include covalently bonded TMDs and metallic materials and function as transition regions lower the tunnel barrier. The gradation regions 137 help to establish end-bonded contact scheme, which provides an efficient path for charge injection and thus lowers the contact resistance between the channel layer 135 and the metallic stacks 130. In addition, as the formation of the channel region and the source and drain terminals is performed on-site in a self-aligned way, the growth process used for forming the channel region and the source and drain terminals can be appropriately controlled and the yield is improved. Overall, the performance of the FET device is also enhanced.

In some embodiments of the present disclosure, a transistor device having fin structures, source and drain terminals, extending portions and a gate structure is provided. The fin structures are disposed on a material layer. The fin structures are arranged in parallel and extending in a first direction. The source and drain terminals are disposed on the fin structures and the material layer and cover opposite ends of the fin structures. The extending portions are disposed respectively on the fin structures, and each extending portion connects and extends between the source and drain terminals on the same fin structure. The gate structure is disposed on the extending portions and across the fin structures. The gate structure extends in a second direction perpendicular to the first direction. The extending portions include a first material containing a transition metal and a chalcogenide, the source and drain terminals include a metallic material, and the extending portions are covalently bonded with the source and drain terminals.

In another embodiment of the present disclosure, a transistor device having a first material layer, a second material layer, a third material layer, a gate dielectric layer and a gate structure is provided. The second material layer is disposed on the first material layer, and the second material layer includes fin structures spaced apart and arranged in parallel. The third material layer is disposed on the second material layer and covers the fin structures. The third material layer includes pairs of first portions and second portions located between the pairs of first portions. Each pair of first portions covers opposite ends of each of the fin structures. Each of the second portions extends between each pair of first portions and covers sidewalls and a top surface of each of the fin structures. The gate dielectric layer is disposed on the third material layer and over the first material layer. The gate structure is disposed on the gate dielectric layer and over the second portions. The second portions include a fourth material containing a transition metal and a chalcogenide, the pairs of first portions include a metallic material and a covalently bonded material of the fourth material and the metallic material is existent between the first and second portions.

In yet another embodiment of the present disclosure, a method of fabricating a transistor device is described. A first material layer is provided and a second material layer is provided on the first material layer. The second material layer is patterned to form fin structures on the first material layer. Block stacks are formed on the first material layer and cover portions of the fin structures. Metallic stacks are formed on the covered portions of the fin structures and channel layers are formed on uncovered portions of the fin structures and between the metallic stacks through performing a growth process. A gate structure is formed on the channel layers and across over the fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor device, comprising:
   at least one fin structure, wherein the at least one fin structure extends in a first direction;
   source and drain terminals, disposed on the at least one fin structure and covering opposite ends of the at least one fin structure;
   an extending portion, disposed on the at least one fin structure, wherein the extending portion extends between the source and drain terminals, and the extending portion connects to the source and drain terminals through gradation regions respectively located between the source and drain terminals and the extending portion; and a gate structure disposed on the extending portion and across the at least one fin structure, wherein the gate structure extends in a second direction perpendicular to the first direction;

wherein the extending portions include a transition metal chalcogenide material, the source and drain terminals include a metallic material, and the gradation regions include a covalently bonded material of the transition metal chalcogenide material and the metallic material.

2. The transistor device according to claim 1, wherein the transition metal chalcogenide material comprises $MoS_2$, $MoSe_2$, $MoTe_2$, $WS_2$, $WSe_2$, or a mixture thereof.

3. The transistor device according to claim 2, wherein a material of the gate structure includes Pt, Pd, Au, W, titanium nitride (TiN), tantalum nitride (TaN), tungsten nitride (WN), or a combination thereof.

4. The transistor device according to claim 1, wherein the metallic material is a metal alloy including platinum (Pt), palladium (Pd), gold (Au), nickel (Ni), titanium (Ti) or a combination thereof.

5. The transistor device according to claim 1, wherein the at least one fin structure includes a crystalline material.

6. The transistor device according to claim 1, further comprising contacts connecting to the source and drain terminals.

7. A transistor device, comprising:
a fin structure;
a composite layer, disposed on and covering the fin structure, wherein the second material layer includes a pair of first portions covering opposite ends of the fin structure, a second portion located between the pair of first portions, and a pair of third portions disposed between the second portion and the pair of first portions, the pair of third portions connects the pair of first portions and the second portion, and the second portion extends between the pair of third portions;
a gate dielectric layer disposed on the second material layer; and
a gate structure disposed on the gate dielectric layer and over the second portion, wherein the pair of first portions includes a metallic material, the second portion includes a transition metal chalcogenide material, and the pair of third portions includes a covalently bonded material of the transition metal chalcogenide material and the metallic material.

8. The transistor device according to claim 7, wherein the transition metal chalcogenide material includes $MoS_2$, $MoSe_2$, $MoTe_2$, $WS_2$, $WSe_2$, or a mixture thereof, and the metallic material is metal alloy including platinum (Pt), palladium (Pd), gold (Au), nickel (Ni), titanium (Ti) or a combination thereof.

9. The transistor device according to claim 8, wherein the metallic material further includes molybdenum (Mo) or selenium (Se).

10. The transistor device according to claim 7, wherein the pair of first portions is located at two opposite sides of the gate structure and covers sidewalls and a top surface of the opposite ends of the fin structure.

11. The transistor device according to claim 7, further comprising a dielectric material located below the fin structure, wherein the fin structure includes a crystalline material.

12. The transistor device according to claim 7, wherein the gate dielectric layer includes hafnium oxide, aluminum oxide, zirconium oxide or a combination thereof, and the gate structure includes Pt, Pd, Au, tungsten (W), titanium nitride (TiN), tantalum nitride (TaN), tungsten nitride (WN), or a combination thereof.

13. A method of fabricating a transistor device, comprising:
forming a fin structure;
forming metal-containing blocks on the fin structure covering opposite end portions of the fin structure;
forming metallic blocks on the covered opposite end portions of the fin structure and forming an extending portion on the uncovered portion of the fin structure and extending between the metallic blocks through performing a growth process; and
forming a gate structure across over the fin structure and over the extending portion.

14. The method according to claim 13, further comprising forming a gate dielectric layer over the fin structure and over the metallic blocks and the extending portion before forming the gate structure.

15. The method according to claim 14, further comprising forming an interlayer dielectric layer over the fin structure covering the metallic blocks, the extending portion and the gate structure, and forming contacts in the interlayer dielectric layer and connected to the metallic blocks.

16. The method according to claim 13, wherein forming metal-containing blocks comprises forming a first metal oxide layer, a second metal layer and a third metal oxide layer in sequence over the fin structure, conformally covering the fin structure and patterning the first metal oxide layer, the second metal layer and the third metal oxide layer into the metal-containing blocks covering opposite ends of the fin structure.

17. The method according to claim 16, wherein the first or third metal oxide layer includes molybdenum oxide (MoO), tungsten oxide (WO), or a mixture thereof, and the second metal layer includes platinum (Pt), palladium (Pd), gold (Au), nickel (Ni), titanium (Ti) or a combination thereof.

18. The method according to claim 16, wherein performing a growth process includes performing a chemical vapor deposition process, and the first metal oxide layer, the second metal layer and the third metal oxide layer in the metal-containing blocks grow into the metallic blocks and the extending portion through the chemical vapor deposition process.

19. The method according to claim 18, further comprising forming gradation regions between the metallic blocks and the extending portion and connecting the metallic blocks and the extending portion through performing a growth process.

20. The method according to claim 18, wherein performing the chemical vapor deposition process includes performing a thermal chemical vapor deposition process at a temperature ranging from about 600° C.~1000° C.

* * * * *